United States Patent [19]

Miyanaga

[11] Patent Number: 5,843,844
[45] Date of Patent: Dec. 1, 1998

[54] PROBE SHEET AND METHOD OF MANUFACTURING THE SAME

[75] Inventor: Isao Miyanaga, Osaka, Japan

[73] Assignee: Matsushita Electric Industrial Co., Ltd., Osaka, Japan

[21] Appl. No.: 590,572

[22] Filed: Jan. 24, 1996

[30] Foreign Application Priority Data

Jan. 25, 1995 [JP] Japan ................................. 7-009404

[51] Int. Cl.⁶ ................................................ H01L 21/00
[52] U.S. Cl. ................... 438/694; 216/2; 216/86; 216/99; 324/724; 438/18; 438/740
[58] Field of Search .................. 156/626.1, 627.1, 156/345 LC; 216/2, 13, 14, 18, 41, 86, 61, 99, 100, 104; 437/8; 324/719, 722, 724; 438/11, 14, 18, 694, 705, 740, 745, 751, 753, 754, 756

[56] References Cited

U.S. PATENT DOCUMENTS

| 4,566,184 | 1/1986 | Higgins et al. ............... 437/8 X |
| 4,994,735 | 2/1991 | Leedy ............................ 324/158 |
| 5,092,033 | 3/1992 | Nishiguchi et al. .......... 437/8 X |

FOREIGN PATENT DOCUMENTS 63-263738  10/1988  Japan .

Primary Examiner—William Powell
Attorney, Agent, or Firm—McDermott, Will & Emery

[57] ABSTRACT

Insulation films which include a bump formation portion are formed on a semiconductor layer which serves as a thin layer. Metallic wire patterns are formed to fill up the bump formation portion, on the insulation film. The insulation film, the metallic wire pattern and the insulation film are formed in this order on the metallic wire pattern. A bump made of Ni is formed on a lower surface of the bump formation portion of the metallic wire pattern.

14 Claims, 15 Drawing Sheets

F I G. 2 (a)
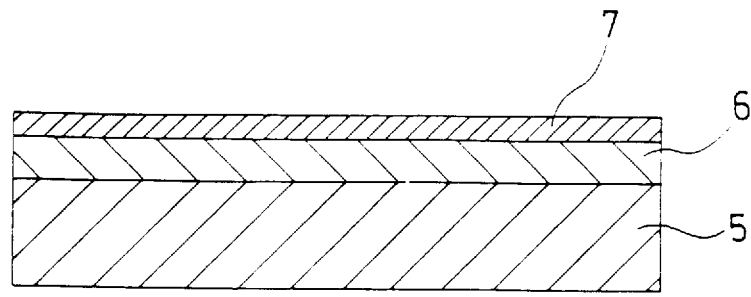
F I G. 2 (b)
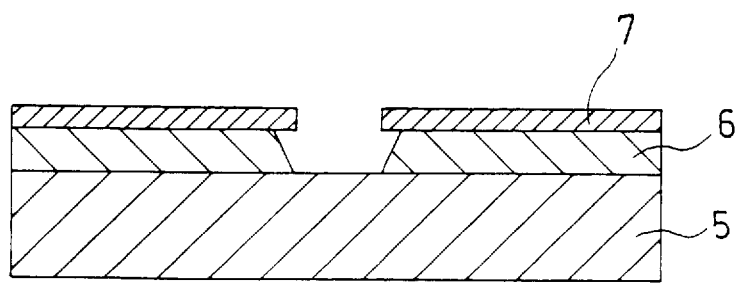
F I G. 2 (c)
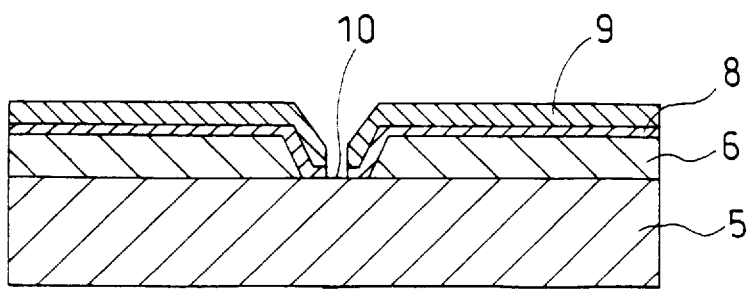

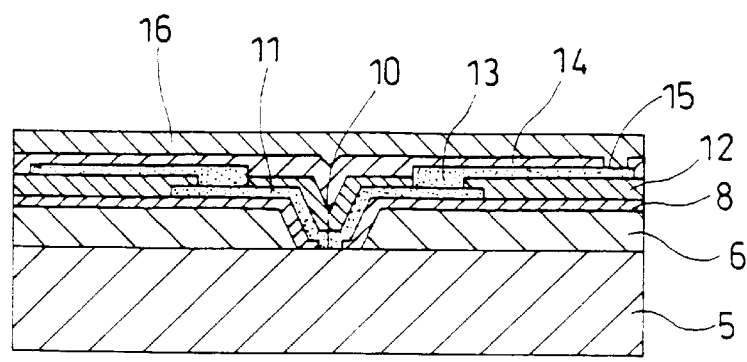
F I G. 3 (a)
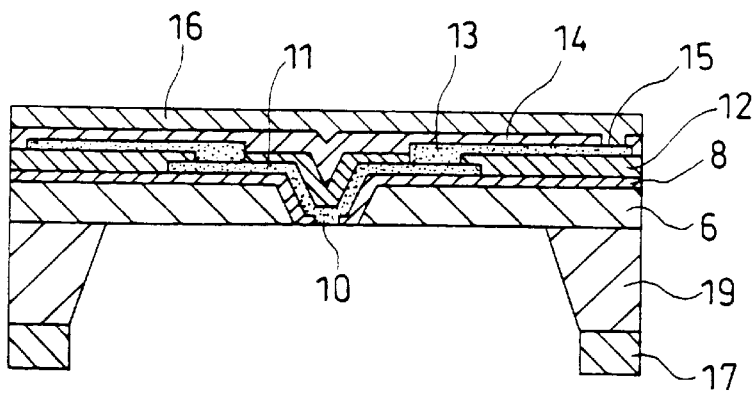
F I G. 3 (b)
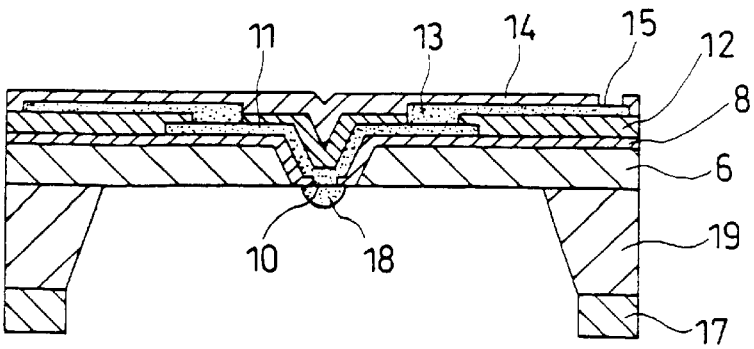
F I G. 3 (c)

IMPLANTATION OF BORON

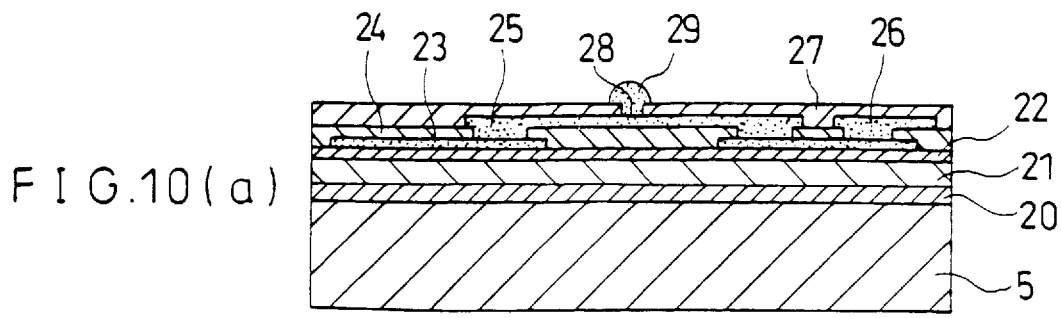
F I G. 10 (a)
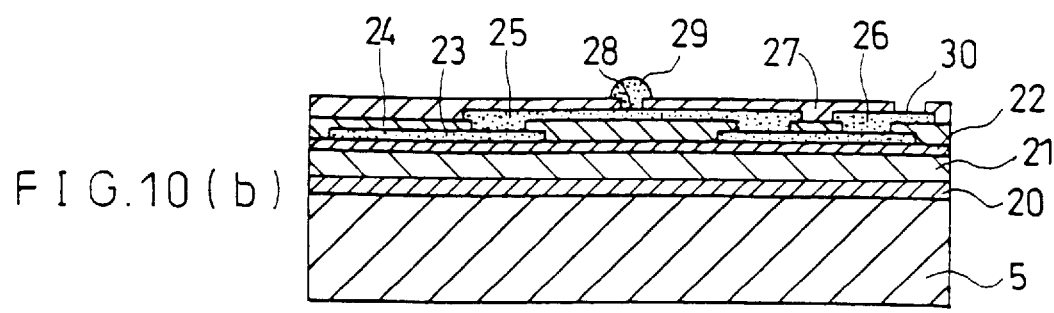
F I G. 10 (b)
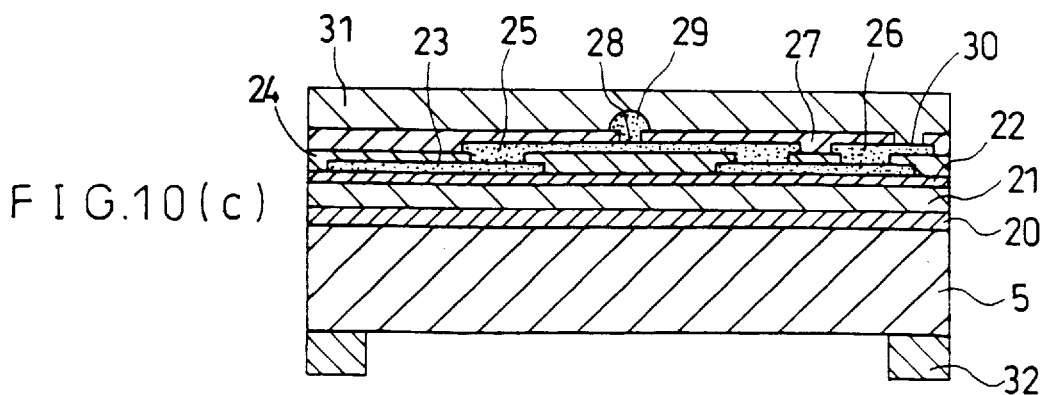
F I G. 10 (c)
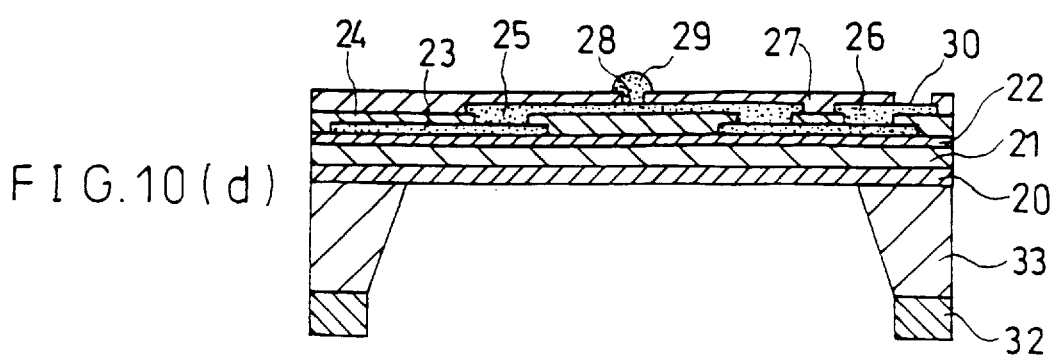
F I G. 10 (d)

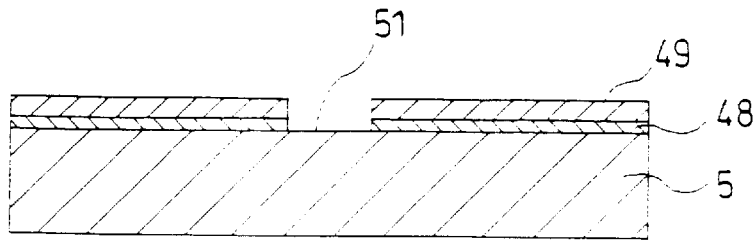
F I G. 14 ( a )
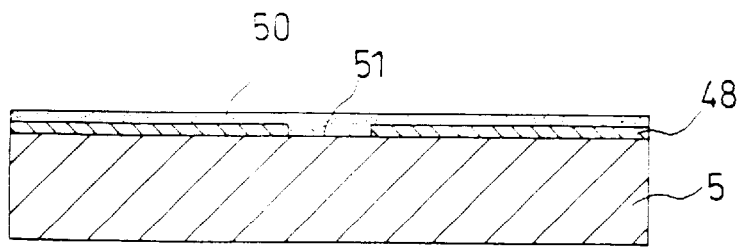
F I G. 14 ( b )
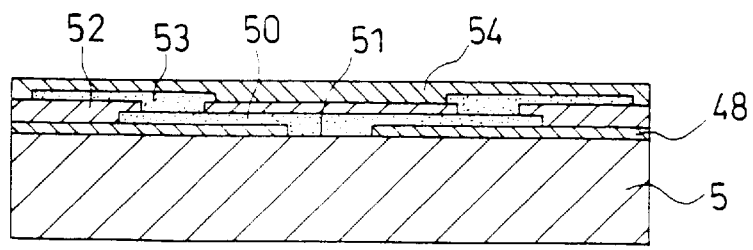
F I G. 14 ( c )
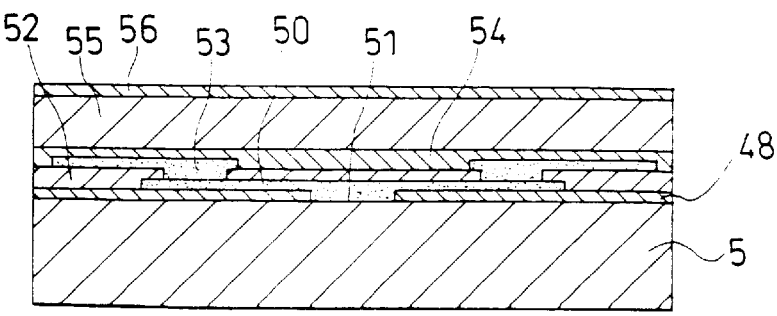
F I G. 14 ( d )

PROBE SHEET AND METHOD OF MANUFACTURING THE SAME

BACKGROUND OF THE INVENTION

1. Field of the Invention

The present invention relates to a probe sheet for inspecting an integrated circuit which is formed on a semiconductor wafer, as it is in a wafer state, and to a method of manufacturing such a probe sheet.

2. Description of the Background Art

In recent years, efforts have been taken to improve the speed of transmitting a signal between LSIs, as the speed of LSIs became faster. One approach among the efforts is a multichip module (MCM). In a multichip module, LSI which are not packaged are disposed very close to each other and terminals of the LSIs are connected to each other, to increase the signal transmission speed between the LSIs.

A multichip module needs LSIs which are not packaged, i.e., LSIs in a so-called barechip state. This has created an increasing demand for inspection of LSIs as they are in a semiconductor wafer state.

To realize this, a probe card in which wires and bumps are formed on a silicon wafer has been proposed in the past [David B, et. al., "A COST-EFFECTIVE WAFER-LEVEL BURN-IN TECHNOLOGY," Proc. ICEMM, Denver, pp. 34–40 (1994)].

FIG. 16 is a cross sectional view showing an inspection method using a conventional probe card. On a silicon substrate 1 which is shown in FIG. 16, a power source, GND and a signal wire pattern (not shown) are formed. Bumps 2 made of solder are formed on wires on the silicon substrate 1. Ribbon cables 3 are disposed to ensure that the bumps 2 and the wires which are formed on the silicon substrate 1 to be electrically connected to the outside. The silicon substrate 1, the bumps 2 and the ribbon cables 3 form a probe card. A semiconductor wafer 4 made of silicon which is to be inspected is mounted on the probe card.

The semiconductor wafer 4 is inspected as it is mounted on the probe card, with electrode pads (not shown) of LSIs and the bumps 2 in a contact to each other. Electric connection to the outside which is required for inspection is realized through the electrode pads of the LSIs, the bumps 2, the wires which are formed on the silicon substrate 1, and the ribbon cables 3.

As described above, all LSIs on the semiconductor wafer 4 can be inspected at the same time, by supplying a power source voltage and a signal to all LSIs on the semiconductor wafer 4. Since the silicon substrate 1 and the semiconductor wafer 4 have the same thermal expansion coefficient, the electrode pads of the LSIs and the bumps 2 do not get displaced from each other even when the temperature is changed. This makes it possible to conduct burn-in inspection of the LSIs in a semiconductor wafer state.

However, in the conventional probe card as above, since the silicon substrate 1 and the semiconductor wafer 4 are both hard, even though the silicon substrate 1 and the semiconductor wafer 4 are pressed into contact to each other, due to warping of the silicon substrate 1 or the semiconductor wafer 4 or due to a difference in height between the bumps 2, there are problems created such as uneven contact resistances between the bumps 2 and the electrode pads of the semiconductor wafer 4 and a failure to conduct between some bumps 2 and some electrode pads.

SUMMARY OF THE INVENTION

Considering the above, the present invention aims to realize a uniform constant resistance between bumps and electrode pads of a semiconductor wafer and to eliminate a conducting failure between the bumps and the electrode pads of the semiconductor wafer.

To achieve the object above, according to the present invention, bumps and metallic wire patterns are formed on a thin film which is formed by a semiconductor, and the thin film is deformed during inspection so that the bumps and electrode pads are brought into contact without fail.

A first probe sheet according to the present invention comprises: a thin film which is formed by a semiconductor to have a predetermined region open; a first insulation film which is formed on one surface side of the thin film to have an opening portion within the predetermined region; a metallic wire pattern which is formed on one surface side of the first insulation film, so as to fill up the opening portion; a second insulation film which is formed on the entire surface of one surface of the metallic wire pattern; and a bump which is formed on the other surface side, at a portion of the metallic wire pattern located in the opening portion, so as to be electrically connected to the metallic wire pattern.

A second probe sheet according to the present invention comprises: a thin film which is formed by a semiconductor; a first insulation film which is formed on the entire surface of one surface of the thin film; a metallic wire pattern which is formed on one surface side of the first insulation film; a second insulation film which is formed on one surface of the metallic wire pattern so as to include an opening portion; and a bump which is formed within the opening portion so as to be electrically connected to the metallic wire pattern and to protrude beyond the second insulation film.

In the first or the second probe sheet, when the probe sheet and a semiconductor wafer are positioned to face each other and pressed close toward each other with bumps and electrode pads corresponding to each other, the probe sheet is flexibly deformed to conform to warping of the semiconductor wafer or a difference in height between the bumps, and consequently, the bumps and the electrode pads are brought into a uniform contact without fail, thereby reducing a difference in contact resistance within a wafer surface and eliminating a contact failure between the bumps and the electrode pads on the semiconductor wafer. Further, the probe sheet with such a characteristic is manufactured at a cheap cost, using a bump forming technique by plating.

A third probe sheet according to the present invention comprises: a thin film which is formed by a semiconductor to have a predetermined region open; a first insulation film which is formed on one surface side of the thin film to have a first opening portion within the predetermined region; a metallic wire pattern which is formed on one surface side of the first insulation film, so as to fill up the first opening portion; a first bump which is formed on the other surface side, at a portion of the metallic wire pattern located in the first opening portion, so as to be electrically connected to the metallic wire pattern; a second insulation film which is formed on the entire surface of one surface of the metallic wire pattern so as to have a second opening portion; and a second bump which is formed within the second opening portion of the second insulation film so as to be electrically connected to the metallic wire pattern and to protrude beyond the second insulation film.

The third probe sheet creates en effect similar to that realized by the first or the second probe sheet, and in addition, since the bumps are formed on the both sides of the third probe sheet, if semiconductor wafers seating LSIs are disposed on the both sides of the probe sheet, it is possible to connect the LSIs with the probe sheet interposed in the middle and to inspect the LSIs which are disposed on the both sides at the same time.

A method of manufacturing the first probe sheet according to the present invention comprises: a first step of forming a semiconductor layer on one surface of a semiconductor substrate so that the semiconductor layer has a predetermined region open and a different impurity concentration or a different conductivity type from the semiconductor substrate; a second step of forming a first insulation film on the entire surface of one surface of the semiconductor layer; a third step of forming an opening portion in the first insulation film enclosed by the predetermined region to such an extent not to expose the semiconductor layer; a fourth step of depositing a metallic film on the entire surface of one surface of the first insulation film; a fifth step of forming a metallic wire pattern by selectively etching the metallic film in such a manner to leave a portion within the opening portion; a sixth step of depositing a second insulation film on the entire surface of one surface of the metallic wire pattern; a seventh step of removing the semiconductor substrate by etching while using the semiconductor layer as an etching stopper, to thereby expose the metallic wire pattern to the other surface side; and an eighth step of forming a bump by plating in an exposed region of the metallic wire pattern which is exposed to the other surface side.

According to the method of manufacturing the first probe sheet, since the semiconductor substrate is removed and the metallic wire pattern is exposed to the other surface side when etching is executed using the semiconductor layer as an etching stopper, it is possible to form a bump by plating in the exposed region of the metallic wire pattern which is exposed to the other surface side. This makes it possible to manufacture the first probe sheet.

In the method of manufacturing the first probe sheet, the first step preferably comprises: a semiconductor layer forming step of epitaxially growing the semiconductor layer on one surface of the semiconductor substrate; and an opening portion forming step of forming the predetermined region open by selectively etching the semiconductor layer.

Since the semiconductor layer is selectively etched after epitaxially growing the semiconductor layer on one surface of the semiconductor substrate, the semiconductor layer with the predetermined region open is easily formed.

The opening portion forming step preferably comprises a step of etching while using the semiconductor substrate as an etching stopper, utilizing the different impurity concentration or the different conductivity type. This makes it possible to etch using the semiconductor substrate as an etching stopper without fail.

In the method of manufacturing the first probe sheet, the first step preferably comprises: a semiconductor layer forming step of forming the semiconductor layer by ion implantation; another semiconductor layer forming step of forming another semiconductor layer on the entire surface of one surface of the previous semiconductor layer; and an opening portion forming step of forming the predetermined region open by selectively etching the previous semiconductor layer and the another semiconductor layer.

Since the previous semiconductor layer and the another semiconductor layer are selectively etched after growing the previous semiconductor layer by ion implantation and subsequently growing the another semiconductor layer on the entire surface of one surface of the previous semiconductor layer, it is possible to form the semiconductor layers which have different impurity concentrations or different conductivity types, without fail.

The another semiconductor layer forming step preferably comprises a step of epitaxially growing the semiconductor layer. By an epitaxial growth method, the another semiconductor layer is easily formed.

The opening portion forming step preferably comprises a step of etching while using the semiconductor substrate as an etching stopper, utilizing the different impurity concentration or the different conductivity type. This makes it possible to form the opening portion easily.

A method of manufacturing the second probe sheet according to the present invention comprises: a first step of forming a semiconductor layer on the entire surface of one surface of a semiconductor substrate so that the semiconductor layer has a different impurity concentration or a different conductivity type from the semiconductor substrate; a second step of forming a first insulation film on the entire surface of one surface of the semiconductor layer; a third step of depositing a metallic film on the entire surface of one surface of the first insulation film; a fourth step of forming a metallic wire pattern by selectively etching the metallic film; a fifth step of forming a second insulation film on the entire surface of one surface of the metallic wire pattern; a sixth step of forming an opening portion in the second insulation film to thereby expose the metallic wire pattern to the opening portion; a seventh forming a bump by plating in an exposed region of the metallic wire pattern which is exposed to the opening portion; and an eighth step of removing the semiconductor substrate.

In the method of manufacturing the second probe sheet, the insulation film is formed which has the opening portion on one surface side of the metallic wire pattern which is formed on the semiconductor layer, and etching is performed using the opening portion of the insulation film as a mask, whereby the metallic wire pattern is exposed to the opening portion. The bump is therefore formed by plating, completing the second probe sheet.

In the method of manufacturing the second probe sheet, the first step preferably comprises a step of epitaxially growing the semiconductor layer. By an epitaxial growth method, the semiconductor layer is easily formed.

In the method of manufacturing the second probe sheet, the first step preferably comprises: a semiconductor layer forming step of forming the semiconductor layer by ion implantation; and another semiconductor layer forming step of forming another semiconductor layer on the entire surface of one surface of the previous semiconductor layer.

Since the another semiconductor layer is formed on the entire surface of one surface of the previous semiconductor layer which is formed by ion implantation, it is easy to form the semiconductor layers which have different impurity concentrations or different conductivity types, on one surface side of the semiconductor substrate.

It is preferable to epitaxially grow the another semiconductor layer in the another semiconductor layer forming step. This makes it possible to form the another semiconductor layer by epitaxially growth.

A method of manufacturing the third probe sheet according to the present invention comprises: a first step of forming a first insulation film on the entire surface of one surface of a semiconductor substrate; a second step of forming an opening portion in the first insulation film, to thereby expose the semiconductor substrate to the opening portion; a third step of depositing a metallic film on the entire surface of one surface of the first insulation film; a fourth step of forming a metallic wire pattern by selectively etching the metallic film; a fifth step of forming a second insulation film on the entire surface of one surface of the metallic wire pattern; a sixth step of forming a semiconductor layer on the entire surface of one surface of the second insulation film; a seventh step of forming a third insulation film on the entire surface of one surface of the semiconductor layer; an eighth step of removing the semiconductor substrate; and a ninth step of forming a bump by plating in an exposed region of the metallic wire pattern which is exposed to the other surface side.

In the method of manufacturing the third probe sheet, since the semiconductor substrate is removed when etching is performed using the insulation film as an etching stopper, thereby exposing the metallic wire pattern to the other surface side, the bump can be formed by plating in the exposed region of the metallic wire pattern which is exposed to the other surface side. The third probe sheet is manufactured in this manner.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2C are cross sectional views showing each step of a first method of manufacturing a probe sheet according to the first preferred embodiment of the present invention;

FIGS. 3A to 3C are cross sectional views showing each step of the first method of manufacturing a probe sheet according to the first preferred embodiment of the present invention;

FIGS. 10A to 10D are cross sectional views showing each step of the second method of manufacturing a probe sheet according to the second preferred embodiment of the present invention;

FIGS. 14A to 14D are cross sectional views showing each step of a method of manufacturing a probe sheet according to the fourth preferred embodiment of the present invention;

DESCRIPTION OF THE PREFERRED EMBODIMENTS

In the following, preferred embodiments of the present invention will be described, with reference to the associated drawings.

Figure 1:
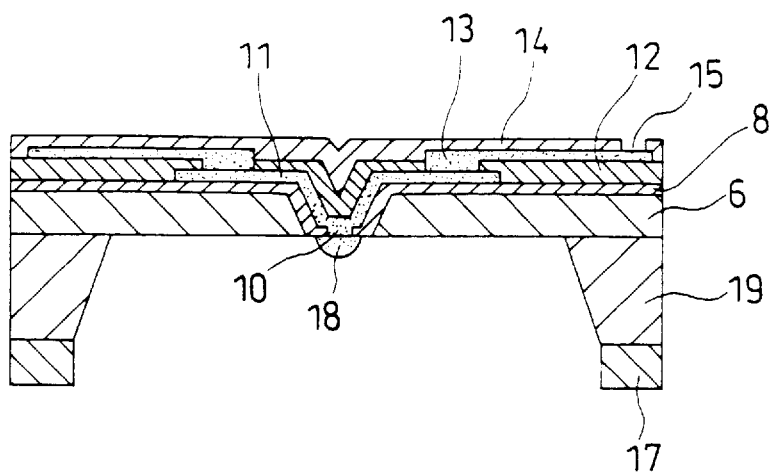
FIG. 1 is a cross sectional view of a probe sheet according to a first preferred embodiment of the present invention.

FIG. 1 is a cross sectional view of a probe sheet according to a first preferred embodiment of the present invention. In FIG. 1, denoted at 6 is a P-type silicon layer which serves as a thin film, denoted at 8 is a first silicon oxide film which serves as a first insulation film, denoted at 12 is a second silicon oxide film, denoted at 14 is a top silicon oxide film which serves as a second insulation film, denoted at 17 is a silicon oxide film which serves as a mask, denoted at 10 is a bump formation portion which serves as an opening portion, denoted at 11 is a first layer metallic wire pattern which is made of copper, denoted at 13 is a second layer metallic wire pattern which is made of copper, denoted at 15 is an external electrode, denoted at 18 is a bump made of Ni, and denoted at 19 is a fixing support ring. As shown in FIG. 1, the bump 18 is formed under the thin silicon layer 6. To inspect a semiconductor wafer seating LSIs, the semiconductor wafer made of silicon which seats the LSIs is disposed below the probe sheet, in such a manner that electrode pads of the LSIs and the bumps 18 contact each other.

In the probe sheet, the bumps 18 which serve as probe terminals are formed at a cheap cost on the silicon layer 6 which is formed thin so as to be flexible, and therefore, when the semiconductor wafer and the probe sheet are positioned to face each other and pressed close toward each other with the bumps 18 and the electrode pads corresponding to each other, the probe sheet is flexibly deformed to conform to warping of the semiconductor wafer or a difference in height between the bumps 18. As a result, the bumps 18 and the electrode pads are brought into a uniform contact without fail, thereby reducing a difference in contact resistance within a wafer surface and eliminating a contact failure between the bumps 18 and the electrode pads which are formed on the semiconductor wafer.

Next, a method of manufacturing the probe sheet as above will be described. FIGS. 2A to 2C and 3A to 3C are cross sectional views showing steps of a first method of manufacturing a probe sheet according to the first preferred embodiment of the present invention.

First, as shown in FIG. 2A, after epitaxially growing the silicon layer 6, which contains P-type impurities (e.g., boron) to a high impurity concentration of $10^{20}/cm^3$ or more, into a thickness of about 50 μm on an N-type silicon substrate 5 which has a low concentration (e.g., $10^{18}/cm^3$ or less) and whose back surface is a (100) surface, a silicon oxide film 7 is formed on the silicon layer 6 to a thickness of about 2 μm.

Next, as shown in FIG. 2B, after removing the bump formation region of the silicon oxide film 7 by performing etching which uses a resist pattern as a mask, the silicon layer 6 is etched using the silicon oxide film 7 as a mask. In this case, HF—HNO$_3$—CH$_3$COOH or a similar chemical solution is used as an etching solution during etching. An HF—HNO$_3$—CH$_3$COOH etching solution selectively removes only a highly doped layer which has a high impurity concentration of $10^{19}$/cm$^3$ or more, and therefore, it is possible to selectively remove the bump formation region of the silicon layer 6 by etching and hence to expose the silicon substrate 5.

Following this, as shown in FIG. 2C, the first silicon oxide film 8 of about 2 μm in thickness is formed on the entire surface after removing the silicon oxide film 7, and a resist pattern 9 is formed on the first silicon oxide film 8. The first silicon oxide film 8 is etched using the resist pattern 9 as a mask, thereby forming the bump formation portion 10 in the first silicon oxide film 8.

Next, as shown in FIG. 3A, after depositing a metallic film made of copper, for example, on the entire surface to a thickness of about 4 μm, the metallic film is etched using the resist pattern as a mask, so that the metallic wire pattern 11 which is formed by the metallic film is obtained. The etching is performed so that the metallic film on the bump formation portion 10 is left unremoved. After forming the second silicon oxide film 12 on the entire surface to a thickness of about 2 μm, a multilayer wire structure as that shown in FIG. 3A is formed depending on the need. The upper metallic wire pattern 13 and the top silicon oxide film 14 have about the same film thicknesses as the metallic wire pattern 11 and the second silicon oxide film 12. The top silicon oxide film 14 is etched using the resist pattern as a mask and selectively removed, thereby partially exposing the upper metallic wire pattern 13 and forming an external electrode 15. Following this, a polyimide film 16 is deposited on the entire surface to a thickness of about 5 μm.

Next, as shown in FIG. 3B, a silicon oxide film is formed on the entire surface of a back surface of the silicon substrate 5 to a thickness of about 2 μm, and is then etched using the resist pattern as a mask, whereby the silicon oxide film 17 which serves as a mask is left only at the periphery of the silicon layer 6. Following this, the silicon substrate 5 is etched using the silicon oxide film 17 as a mask to form the fixing support ring 19 which fixes the silicon layer 6. An etching solution used in the etching (hereinafter "EPW solution") is comprised of ethylenediamine (mole rate: 43.8%), pyrocatechol (mole rate: 4.2%) and pure water (mole rate: 52%), for example. The EPW solution etches (100) silicon surface but does not etch a silicon layer which is doped with P-type impurities, such as boron, to a concentration of 7×10$^{19}$ /cm$^3$ or more. Therefore, using the EPW solution, the silicon substrate 5 is selectively etched to expose the silicon layer 6 and the metallic wire pattern 11.

Next, as shown in FIG. 3C, after removing the polyimide film 16, the bumps 18 made of Ni which serve as probe terminals are formed on the bump formation portion 10 by plating.

The probe sheet which is fabricated through the steps described above and a semiconductor wafer made of silicon which seats LSIs are positioned to face each other and pressed close toward each other, with the bumps 18 and the electrode pads corresponding to each other, the probe sheet is flexibly deformed to conform to warping of the semiconductor wafer or a difference in height between the bumps 18. As a result, the bumps 18 and the electrode pads are brought into a uniform and steady contact. This eliminates a conducting failure between the bumps 18 and the electrode pads and reduces a difference in contact resistance within a wafer surface, whereby electric power is supplied to the LSIs which are disposed on the semiconductor wafer without fail and signals are supplied to and read from the LSIs without fail.

Further, since the thermal expansion coefficient of the probe sheet is dominated by that of the silicon layer 6 even when the temperature is changed, the thermal expansion coefficient of the semiconductor wafer and the thermal expansion coefficient of the probe sheet become equal to each other, which in turn prevents the bumps 18 and the electrode pads from getting displaced from each other.

The surface of the silicon layer 6 on the bumps 18 side is flattened before application of pressure, so that the semiconductor wafer is easily aligned to the probe sheet.

The bumps 18 which serve as probe terminals are formed by plating, and therefore, the probe terminals are formed strong at a very cheap cost.

The silicon layer 6 does not easily get fractured since the silicon layer 6 is epitaxially grown, improving the durability of the probe sheet.

Although the preferred embodiment above requires that the silicon substrate 5 is N-type and has a low concentration and the silicon layer 6 is P-type and has a high concentration, the present invention is not limited to this. Rather, utilizing different impurity concentrations or different conductivity types, impurity concentrations and conductivity types may be combined in a different pattern which allows the semiconductor layer to be used as an etching stopper. For example, in a case where the silicon substrate 5 is P-type and has an impurity concentration of $10^{20}$/cm$^3$ or more, the silicon layer 6 is N-type and has an impurity concentration of $10^{18}$/cm$^3$ or less and the silicon layer 6 is epitaxially grown so as to have (100) surface, the EPW solution may be used to etch the silicon layer 6 as that shown in FIG. 2B and the HF—HNO$_3$—CH$_3$COOH etching solution may be used to etch the silicon substrate 5 as that shown in FIG. 3B.

Although the metallic wire pattern 11 is made of copper in the preferred embodiment above, the metallic wire pattern 11 may be made of other metal as far as the metal can remain unremoved during etching of the silicon substrate 5 and as far as the metal allows for bumps to be formed thereon. For instance, the metallic wire pattern 11 may be made of Au and the bumps 18 may be formed by gold plating.

FIGS. 4A to 4D and 5A to 5C are cross sectional views showing steps of a,second method of manufacturing a probe sheet according to the first preferred embodiment of the present invention.

Figure 4A:
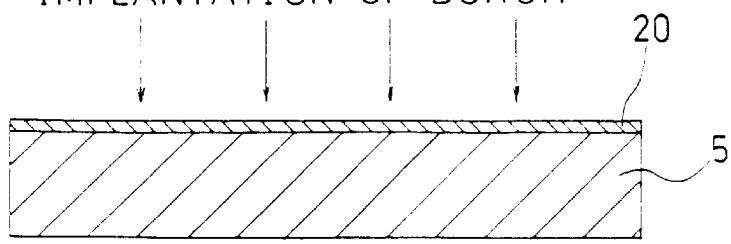
FIGS. 4A to 4D are cross sectional views showing each step of a second method of manufacturing a probe sheet according to the first preferred embodiment of the present invention.

As shown in FIG. 4A, when P-type impurities (e.g., boron) are implanted by ion implantation into the N-type silicon substrate 5 which has a low concentration (e.g., $10^{18}$/cm$^3$ or less) and whose front and back surfaces are (100) surfaces, a P-type silicon layer 20 which has a high impurity concentration of $10^{20}$/cm$^3$ or more and which serves as a first semiconductor layer is formed to a thickness of about 1 μm.

Figure 4B:
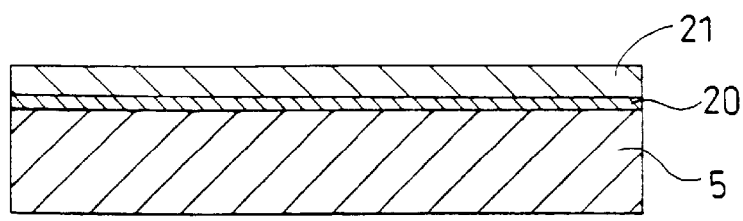

Next, as shown in FIG. 4B, an N-type silicon layer 21 which has a low concentration (e.g., $10^{18}$/cm$^3$ or less) is epitaxially grown on the P-type silicon layer 20 into a thickness of about 50 μm, so that the N-type silicon layer 21 has (100) surface.

Figure 4C:
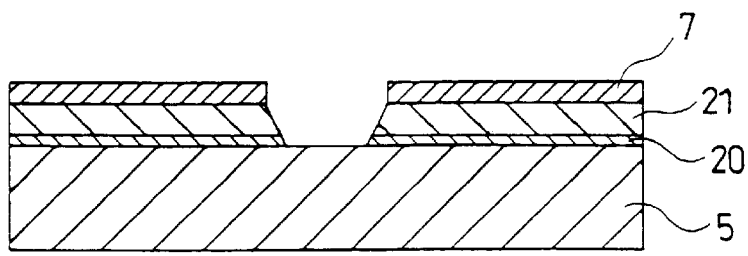

Following this, as shown in FIG. 4C, the silicon oxide film 7 is formed on the entire surface to a thickness of about 2 μm. The silicon oxide film 7 is then etched using the resist pattern as a mask, thereby removing a bump formation region of the silicon oxide film 7, and the N-type silicon layer 21 is etched using the silicon oxide film 7 as a mask. The EPW solution is used at this stage so as to selectively etch the N-type silicon layer 21 and expose the P-type silicon layer 20. The P-type silicon layer 20 is selectively etched with the HF—HNO$_3$—CH$_3$COOH etching solution, using the silicon oxide film 7 and the N-type silicon layer 21 as a mask, whereby the silicon substrate 5 is exposed.

Figure 4D:
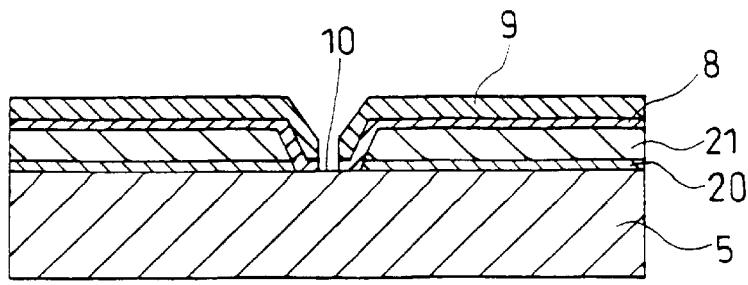
Figure 5A:
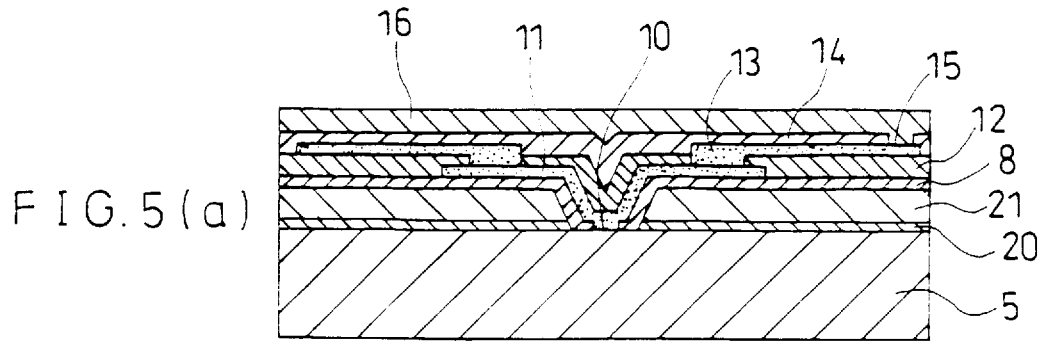
FIGS. 5A to 5C are cross sectional views showing each step of the second method of manufacturing a probe sheet according to the first preferred embodiment of the present invention.
Figure 5B:
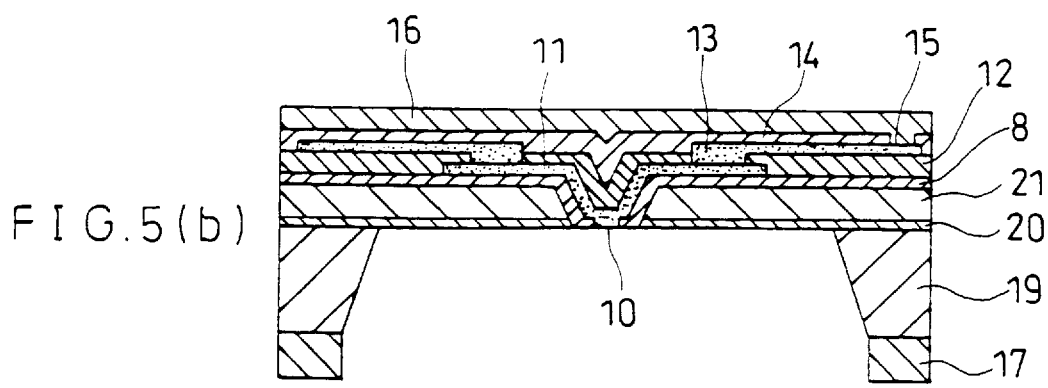
Figure 5C:
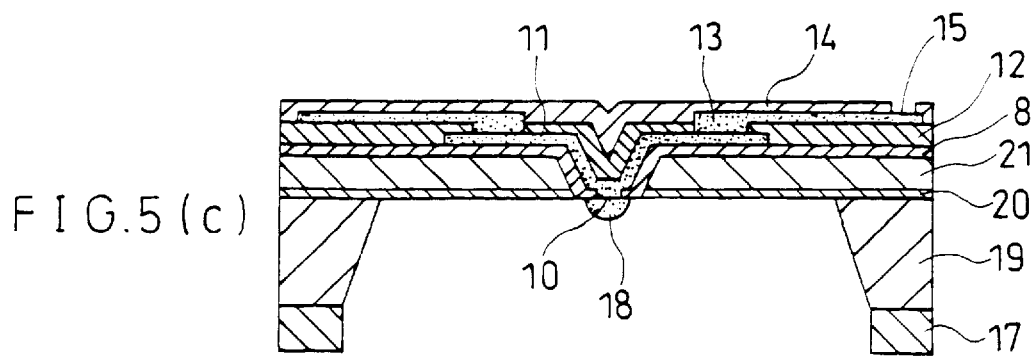

Next, after performing the step which is shown in FIG. 4D in the same manner in which the step shown in FIG. 2C is performed, the steps shown in FIGS. 5A to 5C are performed in the same manner in which the steps shown in FIGS. 3A to 3C are performed.

The second manufacturing method uses ion implantation to grow the P-type silicon layer 20. While it is difficult to epitaxially grow a silicon layer to a high impurity concentration, using ion implantation, it is easy to dope the P-type silicon layer 20 with impurities of a high concentration which serve as an etching stopper.

Figure 6:
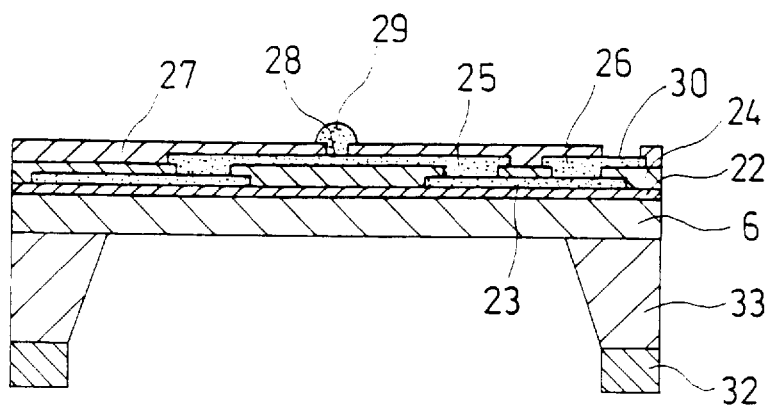
FIG. 6 is a cross sectional view of a probe sheet according to a second preferred embodiment of the present invention.

FIG. 6 is a cross sectional view of a probe sheet according to a second preferred embodiment of the present invention.

In FIG. 6, denoted at 6 is a P-type silicon layer which serves as a thin film, denoted at 22 is a first silicon oxide film which serves as a first insulation film, denoted at 24 is a second silicon oxide film, denoted at 27 is a top silicon oxide film which serves as a second insulation film, denoted at 32 is a silicon oxide film which serves as a mask, denoted at 28 is a bump formation portion which serves as an opening portion, denoted at 23 is a first layer metallic wire pattern which is made of copper, denoted at 25 and 26 are second layer metallic wire patterns which are made of copper, denoted at 29 are bumps made of Ni, denoted at 30 is an external electrode, and denoted at 33 is a fixing support ring. As shown in FIG. 6, the bump 29 is formed on the thin silicon layer 6. To inspect a semiconductor wafer seating LSIs, the semiconductor wafer is disposed above the probe sheet, in such a manner that electrode pads of the LSIs and the bumps 29 contact each other.

While the bumps 18 are formed on the lower side of the probe sheet according to the first preferred embodiment, in the probe sheet according to the second preferred embodiment, the bumps 29 are formed on the upper side. The probe sheet according to the second preferred embodiment creates en effect similar to that realized by the probe sheet according to the first preferred embodiment.

FIGS. 7A to 7C and 8A to 8C are cross sectional views showing steps of a first method of manufacturing a probe sheet according to the second preferred embodiment of the present invention.

Figure 7A:
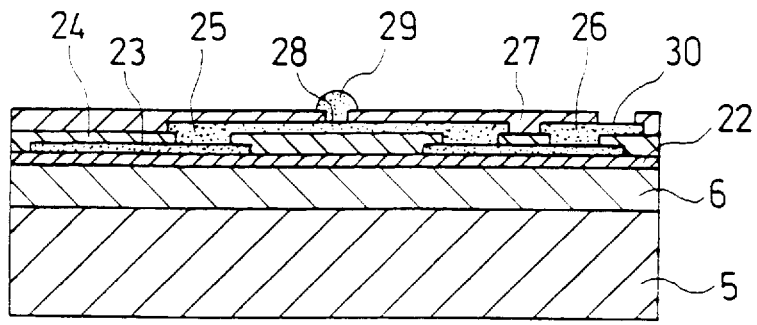
FIGS. 7A to 7C are cross sectional views showing each step of a first method of manufacturing a probe sheet according to the second preferred embodiment of the present invention.

First, as shown in FIG. 7A, the silicon layer 6 which contains P-type impurities (e.g., boron) to a high impurity concentration of $10^{20}/cm^3$ or more is epitaxially grown on the N-type silicon substrate 5 which has a low concentration (e.g., $10^{18}/cm^3$ or less) and whose back surface is (100) surface.

Figure 7B:
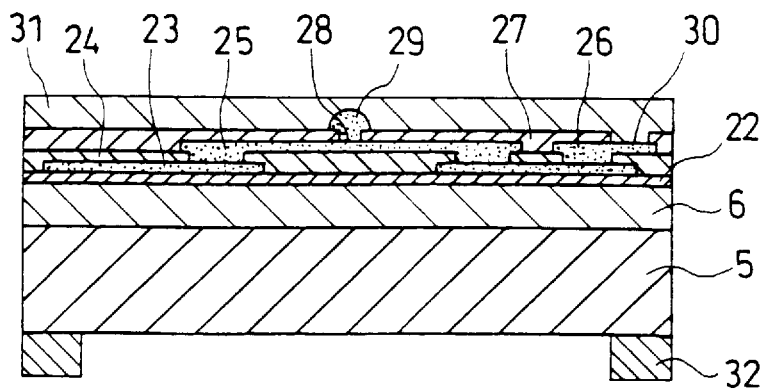

Next, as shown in FIG. 7B, after forming the first silicon oxide film 22 to a thickness of about 2 μm on the silicon layer 6, a metallic film made of copper, for instance, is deposited to a thickness of about 4 μm. The metallic film is etched using a resist pattern as a mask, thereby forming the metallic wire pattern 23. If necessary, a multilayer wire structure as that shown in FIG. 7B is formed. The second layer metallic wire patterns 25 and 26 have about the same thicknesses as the first layer metallic wire pattern 23, while the second silicon oxide film has about the same film thicknesses as the first silicon oxide film 22. Following this, the top silicon oxide film 27 is formed on the entire surface to a thickness of about 2 μm, and is selectively etched using the resist pattern as a mask, so that the second layer metallic wire pattern 25 made of copper, for instance, is exposed and the bump formation portion 28 is defined.

Figure 7C:
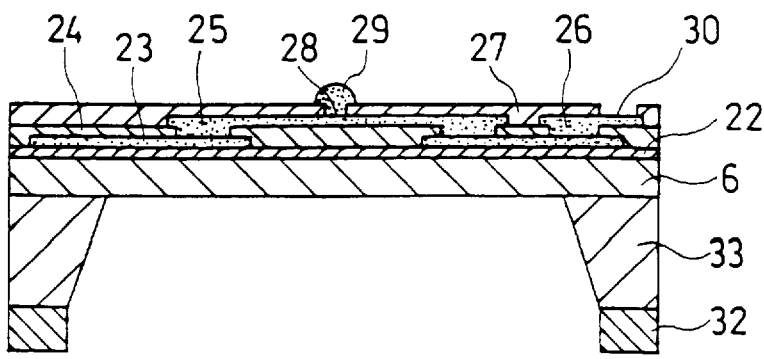

The bumps 29 which serve as probe terminals are then formed on the bump formation portion 28 by plating, as shown in FIG. 7C.

Figure 8A:
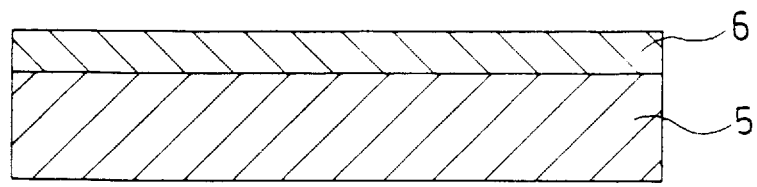
FIGS. 8A to 8C are cross sectional views showing each step of the first method of manufacturing a probe sheet according to the second preferred embodiment of the present invention.

Next, as shown in FIG. 8A, the top silicon oxide film 27 is selectively removed by etching, using the resist pattern as a mask, thereby locally exposing the second layer metallic wire pattern 26 and forming the external electrode 30.

Figure 8B:
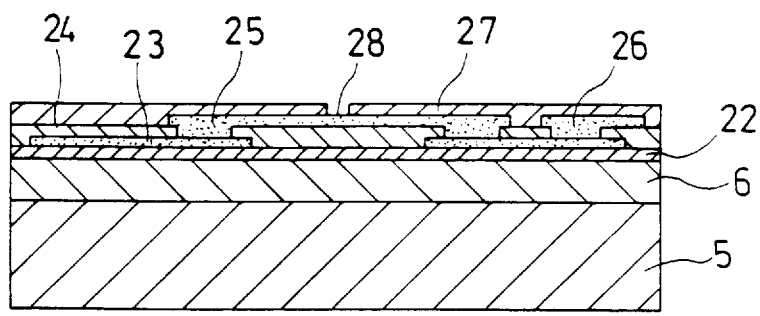

Following this, as shown in FIG. 8B, a polyimide film 31 is deposited on the entire surface to a thickness of about 5 μm. The silicon oxide film 32 which serves as a mask is then formed on the entire surface of a back surface of the silicon substrate 5 to a thickness of about 2 μm, and is etched using the resist pattern as a mask, so as to leave the silicon oxide film 32 only at the periphery of the silicon substrate 5.

Figure 8C:
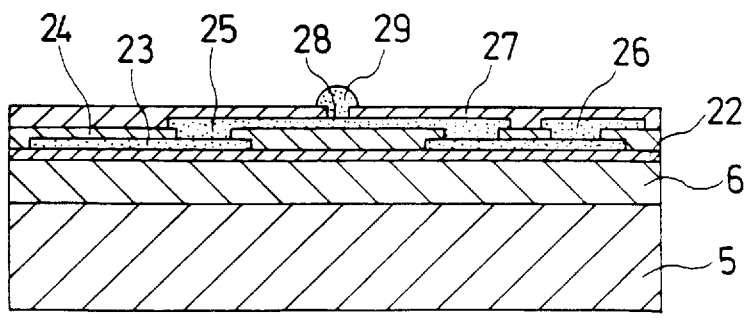

Next, as shown in FIG. 8C, the silicon substrate 5 is etched using the silicon oxide film 32 as a mask, thereby defining the fixing support ring 33 which fixes the silicon layer 6. This etching is performed using the EPW solution as in the manufacturing methods according to the first preferred embodiment, so that the silicon layer 6 is exposed from the back surface side. The polyimide film 31 is then removed.

The probe sheet which is fabricated through the steps described above creates en effect similar to that realized according to the first preferred embodiment. Further, since it is not necessary to etch the silicon layer 6, the manufacturing steps are simpler than those executed in the first preferred embodiment.

Although the preferred embodiment above requires that the silicon substrate 5 is N-type and has a low concentration and the silicon layer 6 is P-type and has a high concentration, the present invention is not limited to this. Rather, utilizing different impurity concentrations or different conductivity types, impurity concentrations and conductivity types may be combined in a different pattern which allows the semiconductor layer to be used as an etching stopper during etching of the silicon substrate 5. For example, where the silicon substrate 5 is P-type and has an impurity concentration of $10^{20}/cm^3$ or more and the silicon layer 6 is N-type and has an impurity concentration of $10^{18}/cm^3$ or less, the HF—HNO$_3$—CH$_3$COOH etching solution may be used to etch the silicon substrate 5 which is shown in FIG. 8C.

In addition, although the second layer metallic wire pattern 25 is made of copper, the second layer metallic wire pattern 25 may be made of other metal as far as the metal allows for bumps to be formed thereon. For instance, the second layer metallic wire pattern 25 may be made of Au and the bumps 29 may be formed by gold plating.

FIGS. 9A to 9C and Figs. 10A to 10D are cross sectional views showing steps of a second method of manufacturing a probe sheet according to the second preferred embodiment of the present invention.

Figure 9A:
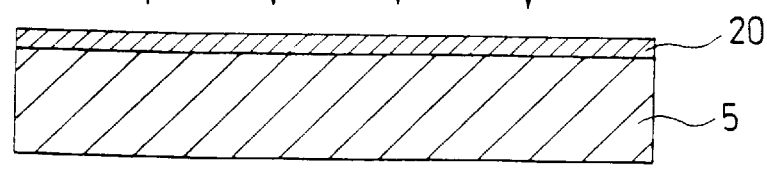
FIGS. 9A to 9C are cross sectional views showing each step of a second method of manufacturing a probe sheet according to the second preferred embodiment of the present invention.

As shown in FIG. 9A, P-type impurities (e.g., boron) are implanted by ion implantation into the N-type silicon substrate 5 which has a low concentration (e.g., $10^{18}/cm^3$ or less) and whose back surface is (100) surface, for example, to form the P-type silicon layer 20 which has a high impurity concentration of $10^{20}/cm^3$ or more to a thickness of about 1 μm, as the first semiconductor layer.

Figure 9B:
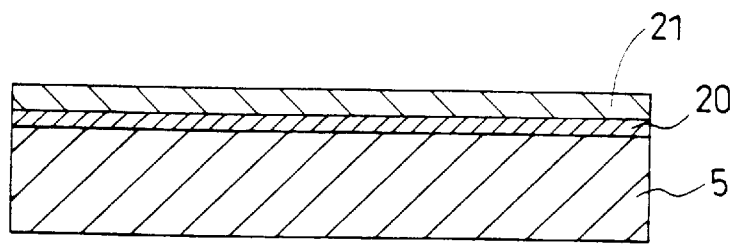
Figure 9C:
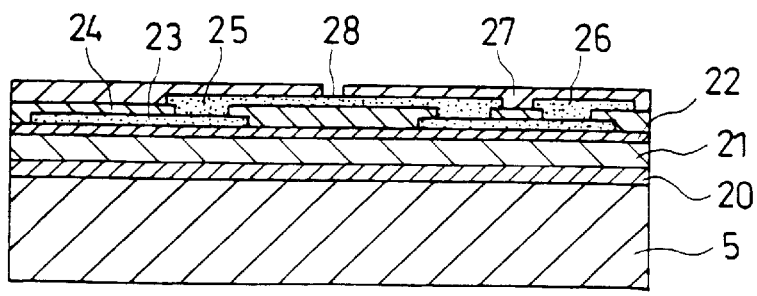

Next, as shown in FIG. 9B, the N-type silicon layer 21 having a low concentration (e.g., $10^{18}/cm^3$ or less), for example, is epitaxially grown into a thickness of about 50 μm on the P-type silicon layer 20. The step shown in FIG. 9C is performed in the same manner in which the step shown in FIG. 7B is performed, the step shown in FIG. 10A is performed in the same manner in which the step shown in FIG. 7C is performed, and the steps shown in FIGS. 10B to 10D are performed in the same manner in which the steps shown in FIGS. 8A to 8C are performed.

As the second manufacturing method of manufacturing a probe sheet according to the first preferred embodiment, this second manufacturing method uses ion implantation to grow the P-type silicon layer 20. The use of ion implantation makes it easy to dope the P-type silicon layer 20 with impurities of a high concentration which serve as an etching stopper.

Figure 11:
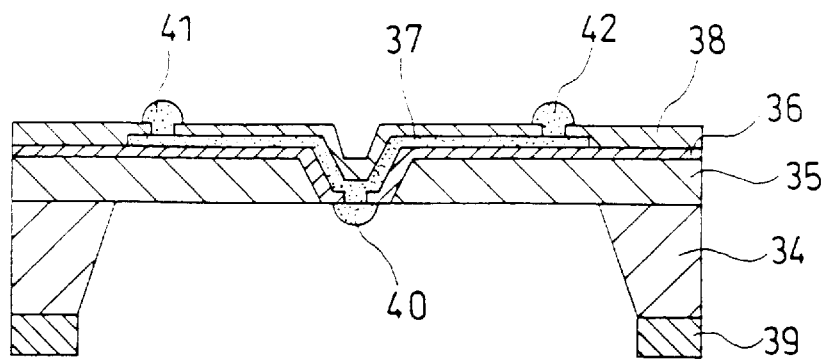
FIG. 11 is a cross sectional view of a probe sheet according to a third preferred embodiment of the present invention.
Figure 12:
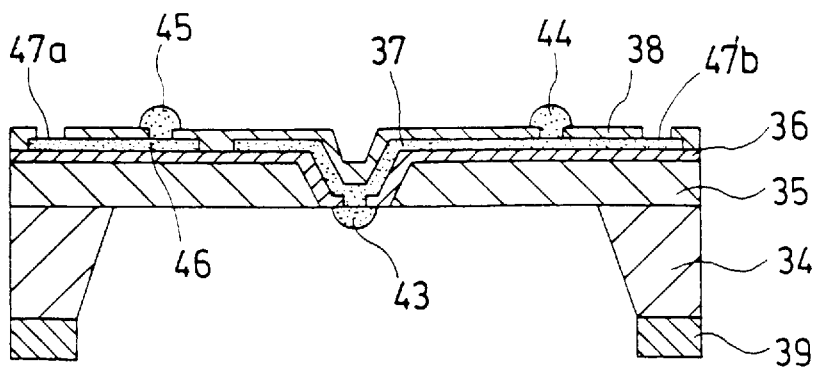
FIG. 12 is a cross sectional view of another probe sheet according to the third preferred embodiment of the present invention.

FIGS. 11 and 12 are cross sectional views of probe sheets according to a third preferred embodiment of the present invention. In FIG. 11, denoted at 35 is a P-type silicon layer which serves as a thin film, denoted at 36 is a silicon oxide film which serves as a first insulation film, denoted at 38 is a silicon oxide film which serves as a second insulation film, denoted at 39 is a silicon oxide film which serves as a mask, denoted at 37 is a first layer metallic wire pattern, denoted at 40 is a first bump made of Ni, denoted at 41 is a second bump made of Ni, denoted at 42 is a third bump made of Ni, and denoted at 34 is a fixing support ring. In FIG. 12, denoted at 35 is a P-type silicon layer which serves as a thin film, denoted at 36 is a silicon oxide film which serves as a first insulation film, denoted at 38 is a silicon oxide film which serves as a second insulation film, denoted at 39 is a silicon oxide film which serves as a mask, denoted at 37 is a first layer first metallic wire pattern, denoted at 46 is a first layer second metallic wire pattern, denoted at 43 is a first bump made of Ni, denoted at 44 is a second bump made of Ni, denoted at 45 is a third bump made of Ni, denoted at 47a is a first external electrode, denoted at 47b is a second external electrode, and denoted at 34 is a fixing support ring.

As shown in FIG. 11, in the third preferred embodiment of the present invention, the first bump 40, the second bump 41 and the third bump 42 are formed on the both sides of the thin silicon layer 35, and the first, the second and the third bumps 40, 41 and 42 are connected to each other by the first layer metallic wire pattern 37. This is achievable by adopting the manufacturing steps of the methods according to the first and the second preferred embodiments. In the structure as that shown in FIG. 11, different semiconductor wafers are disposed on the front side and the back side of the probe sheet, LSI electrode pads of the respective semiconductor wafers and the first, the second and the third bumps 40, 41 and 42 are made conductive with each other, whereby LSIs seated on the semiconductor wafers which are disposed on the both sides of the probe sheet are electrically connected to each other. A multichip module (MCM) is completed in this manner.

Meanwhile, as shown in FIG. 12, if the first external electrode 47a or the second external electrode 47b is formed so as to be conductive with the first, the second and the third bumps 43, 44 and 45, it is possible to inspect the LSIs seated on the semiconductor wafers which are disposed on the both sides of the probe sheet at the same time.

Figure 13:
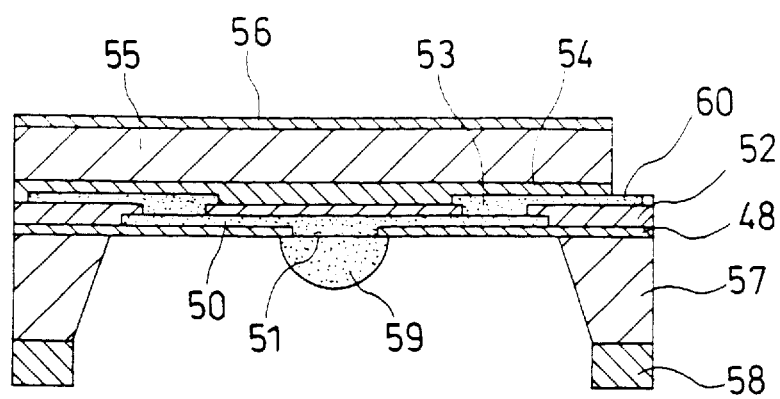
FIG. 13 is a cross sectional view of a probe sheet according to a fourth preferred embodiment of the present invention.

FIG. 13 is a cross sectional view of a probe sheet according to a fourth preferred embodiment of the present invention. Denoted at 55 is a polycrystalline silicon layer which serves as a thin film, denoted at 48 is a first silicon oxide film which serves as a first insulation film, denoted at 52 is a second silicon oxide film, denoted at 54 is a third silicon oxide film which serves as a second insulation film, denoted at 56 is a top silicon oxide film which serves as a third insulation film, denoted at 58 is a silicon oxide film which serves as a mask, denoted at 51 is a bump formation portion which serves as an opening portion, denoted at 50 is a first layer metallic wire pattern which is made of copper, denoted at 53 is a second layer metallic wire pattern which is made of copper, denoted at 59 is a bump made of Ni, denoted at 60 is an external electrode, and denoted at 57 is a fixing support ring. As shown in FIG. 13, the bump 59 is formed below the thin polycrystalline silicon layer 55 in this structure. To inspect a semiconductor wafer seating LSIs, the semiconductor wafer is disposed below the probe sheet, in such a manner that electrode pads of the LSIs and the bumps 59 contact each other.

This probe sheet is equivalent to the probe sheet according to the first preferred embodiment as it is modified to use the polycrystalline silicon layer 55 as the thin film which forms the probe sheet. This probe sheet as well, creates en effect similar to that realized according to the first preferred embodiment. In addition, use of the polycrystalline silicon layer 55 allows this probe sheet to be manufactured cheaper than in the precedent embodiments.

FIGS. 14A to 14D and 15A to 15C are cross sectional views showing steps of a method of manufacturing a probe sheet according to the fourth preferred embodiment of the present invention.

First, as shown in FIG. 14A, the first silicon oxide film 48 having a thickness of about 2 μm is formed on the N-type silicon substrate 5 which has a low concentration (e.g., $10^{18}/cm^3$ or less) and whose back surface is (100) surface. After coated with a resist pattern 49, the first silicon oxide film 48 is selectively etched using the resist pattern 49 as a mask, thereby exposing the silicon substrate 5 and forming the bump formation portion 51.

Next, as shown in FIG. 14B, the first layer metallic wire pattern 50 which is made of copper, for instance, is deposited on the entire surface to a thickness of about 4 μm.

Following this, as shown in FIG. 14C, the first layer metallic wire pattern 50 is etched using the resist pattern as a mask, thereby making the first layer metallic wire pattern 50 into a wire pattern in which the bump formation portion 51 is left unremoved. If necessary, a multilayer wire structure is then formed. The second layer metallic wire pattern 53 and the second silicon oxide film 52 have about the same thicknesses as the first layer metallic wire pattern 50 and the first silicon oxide film 48. The third silicon oxide film 54 is then formed on the entire surface to a thickness of about 2 μm.

Next, as shown in FIG. 14D, after depositing the polycrystalline silicon layer 55 on the entire surface to a thickness of about 50 μm, the third silicon oxide film 56 is formed to a thickness of about 2 μm.

Figure 15A:
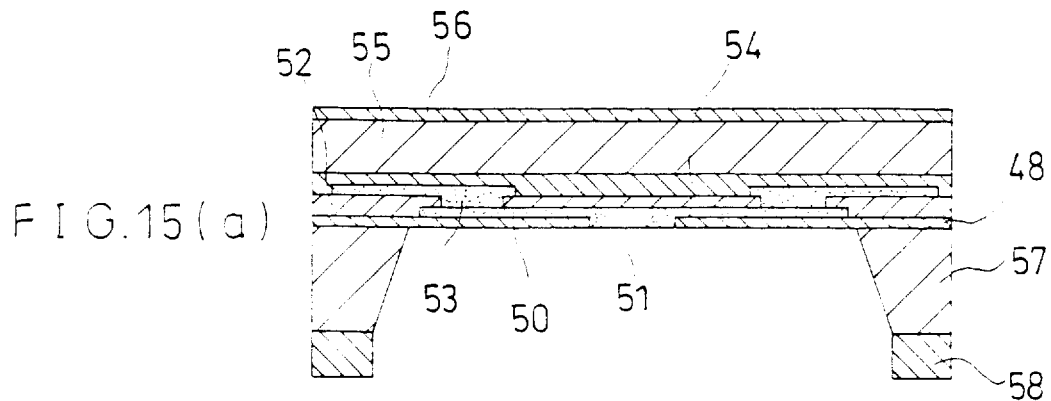
FIGS. 15A to 15C are cross sectional views showing each step of a method of manufacturing a probe sheet according to the fourth preferred embodiment of the present invention.

The silicon oxide film 58 which serves as a mask is then formed on the entire surface of a back surface of the silicon substrate 5 to a thickness of about 2 μm, and is etched using the resist pattern as a mask, so as to leave the mask silicon oxide film 58 only at the periphery of the silicon substrate 5, as shown in FIG. 15A. The silicon substrate 5 is etched using the mask silicon oxide film 58 as a mask, thereby forming the fixing support ring 57 which fixes the silicon layer 6. This etching is performed using the EPW solution as in the manufacturing methods according to the first preferred embodiment, exposing the first silicon oxide film 48 and the first layer metallic wire pattern 50 of the bump formation portion 51 from the back surface side.

Figure 15B:
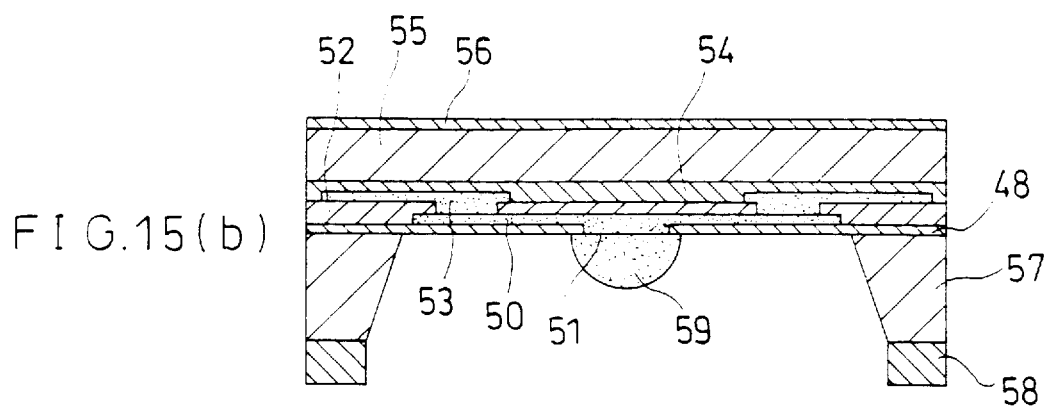

Next, as shown in FIG. 15B, the bump 59 which serves as a probe terminal is then formed on the bump formation portion 51 by plating.

Figure 15C:
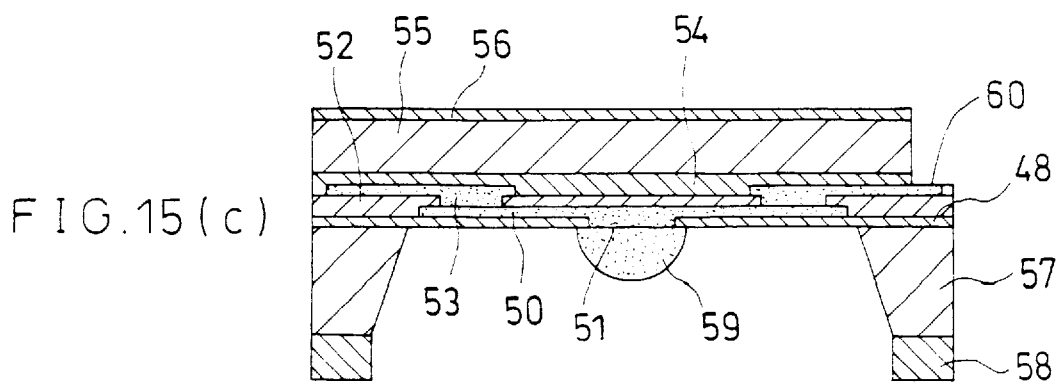
Figure 16:
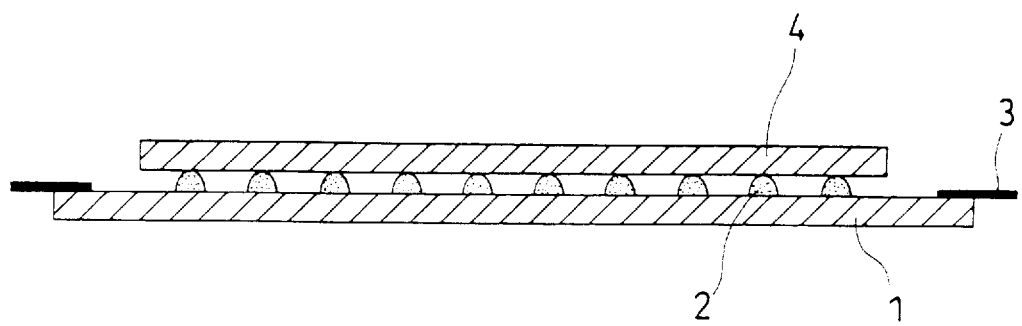
FIG. 16 is a cross sectional view showing an inspection method using a conventional probe card.

Following this, as shown in FIG. 15C, etching is performed using the resist pattern as a mask to etch the top silicon oxide film 56, the polycrystalline silicon layer 55 and the third silicon oxide film 54 in this order, whereby the second layer metallic wire pattern 53 is exposed and the external electrode 60 is formed.

The probe sheet which is fabricated through the steps described above creates en effect similar to that realized according to the first preferred embodiment. Further, use of the polycrystalline silicon layer as the film which forms the probe sheet allows the probe sheet to be manufactured at a low cost.

Although the preferred embodiment above uses the first layer metallic wire pattern 50 which is made of copper, the first layer metallic wire pattern 50 may be made of other metal as far as the metal can remain unremoved during etching of the silicon substrate 5 and as far as the metal allows for bumps to be formed thereon. For instance, the first layer metallic wire pattern 50 may be made of Au and the bumps may be formed by gold plating.

While the invention has been described in detail, the foregoing description is in all aspects illustrative and not restrictive. It is understood that numerous other modifications and variations can be devised without departing from the scope of the invention.

I claim:

1. A probe sheet, comprising:
   a thin film which is formed by a semiconductor to have an open region;
   a first insulation film which is formed on one surface side of said thin film to have an opening portion within said open region;
   a metallic wire pattern which is formed on one surface side of said first insulation film, so as to fill up said opening portion;
   a second insulation film which is formed on the entire surface of one surface of said metallic wire pattern; and
   a bump which is formed on the other surface side, at a portion of said metallic wire pattern located in said opening portion, so as to be electrically connected to said metallic wire pattern.

2. A probe sheet, comprising:
   a thin film which is formed by a semiconductor;
   a first insulation film which is formed on the entire surface of one surface of said thin film;
   a metallic wire pattern which is formed on one surface side of said first insulation film;
   a second insulation film which is formed on one surface of said metallic wire pattern so as to include an opening portion; and
   a bump which is formed within said opening portion of said second insulation film so as to be electrically connected to said metallic wire pattern and to protrude beyond said second insulation film.

3. A probe sheet, comprising:
   a thin film which is formed by a semiconductor to have an open region;
   a first insulation film which is formed on one surface side of said thin film to have a first opening portion within said open region;
   a metallic wire pattern which is formed on one surface side of said first insulation film, so as to fill up said first opening portion;
   a first bump which is formed on the other surface side, at a portion of said metallic wire pattern located in said first opening portion, so as to be electrically connected to said metallic wire pattern;
   a second insulation film which is formed on the entire surface of one surface of said metallic wire pattern so as to have a second opening portion; and
   a second bump which is formed within said second opening portion of said second insulation film so as to be electrically connected to said metallic wire pattern and to protrude beyond said second insulation film.

4. A method of manufacturing a probe sheet, comprising:
   a first step of forming a semiconductor layer on one surface of a semiconductor substrate so that said semiconductor layer has an open region and a different impurity concentration or a different conductivity type from said semiconductor substrate;
   a second step of forming a first insulation film on the entire surface of one surface of said semiconductor layer;
   a third step of forming an opening portion in said first insulation film enclosed by said open region to such an extent not to expose said semiconductor layer;
   a fourth step of depositing a metallic film on the entire surface of one surface of said first insulation film;
   a fifth step of forming a metallic wire pattern by selectively etching said metallic film in such a manner to leave a portion within said opening portion;
   a sixth step of depositing a second insulation film on the entire surface of one surface of said metallic wire pattern;
   a seventh step of removing said semiconductor substrate by etching while using said semiconductor layer as an etching stopper, to thereby expose said metallic wire pattern to the other surface side; and
   an eighth step of forming a bump by plating in an exposed region of said metallic wire pattern which is exposed to the other surface side.

5. The method of manufacturing a probe sheet of claim 4, wherein said first step comprises:
   a semiconductor layer forming step of epitaxially growing the semiconductor layer on one surface of said semiconductor substrate; and
   an opening portion forming step of forming said open region by selectively etching said semiconductor layer.

6. The method of manufacturing a probe sheet of claim 5, wherein said opening portion forming step comprises a step of etching while using said semiconductor substrate as an etching stopper, utilizing said different impurity concentration or said different conductivity type.

7. The method of manufacturing a probe sheet of claim 4, wherein said first step comprises:
   a first semiconductor layer forming step of forming said semiconductor layer by ion implantation;
   a second semiconductor layer forming step of forming a second semiconductor layer on the entire surface of one surface of said semiconductor layer; and
   an opening portion forming step of forming said open region by selectively etching said semiconductor layer and said second semiconductor layer.

8. The method of manufacturing a probe sheet of claim 7, wherein said second semiconductor layer forming step comprises epitaxial growth.

9. The method of manufacturing a probe sheet of claim 7, wherein said opening portion forming step comprises a step of etching while using said semiconductor substrate as an etching stopper, utilizing said different impurity concentration or said different conductivity type.

10. A method of manufacturing a probe sheet, comprising:
- a first step of forming a semiconductor layer on the entire surface of one surface of a semiconductor substrate so that said semiconductor layer has a different impurity concentration or a different conductivity type from said semiconductor substrate;
- a second step of forming a first insulation film on the entire surface of one surface of said semiconductor layer;
- a third step of depositing a metallic film on the entire surface of one surface of said first insulation film;
- a fourth step of forming a metallic wire pattern by selectively etching said metallic film;
- a fifth step of forming a second insulation film on the entire surface of one surface of said metallic wire pattern;
- a sixth step of forming an opening portion in said second insulation film to thereby expose said metallic wire pattern to said opening portion;
- a seventh forming a bump by plating in an exposed region of said metallic wire pattern which is exposed to said opening portion; and
- an eighth step of removing said semiconductor substrate.

11. The method of manufacturing a probe sheet of claim 10, wherein said first step comprises a step of epitaxially growing said semiconductor layer.

12. The method of manufacturing a probe sheet of claim 10, wherein said first step comprises:
- a semiconductor layer forming step of forming said semiconductor layer by ion implantation; and
- another semiconductor layer forming step of forming another semiconductor layer on the entire surface of one surface of said semiconductor layer.

13. The method of manufacturing a probe sheet of claim 12, wherein said another semiconductor layer forming step comprises a step of epitaxially growing said another semiconductor layer.

14. A method of manufacturing a probe sheet, comprising:
- a first step of forming a first insulation film on the entire surface of one surface of a semiconductor substrate;
- a second step of forming an opening portion in said first insulation film, to thereby expose said semiconductor substrate to said opening portion;
- a third step of depositing a metallic film on the entire surface of one surface of said first insulation film;
- a fourth step of forming a metallic wire pattern by selectively etching said metallic film;
- a fifth step of forming a second insulation film on the entire surface of one surface of said metallic wire pattern;
- a sixth step of forming a semiconductor layer on the entire surface of one surface of said second insulation film;
- a seventh step of forming a third insulation film on the entire surface of one surface of said semiconductor layer;
- an eighth step of removing said semiconductor substrate; and
- a ninth step of forming a bump by plating in an exposed region of said metallic wire pattern which is exposed to the other surface side.

* * * * *